United States Patent
Coomer

(10) Patent No.: US 7,358,116 B2
(45) Date of Patent: Apr. 15, 2008

(54) SUBSTRATE CONDUCTIVE POST FORMATION

(75) Inventor: Boyd L. Coomer, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/134,951

(22) Filed: Apr. 29, 2002

(65) Prior Publication Data

US 2003/0203623 A1  Oct. 30, 2003

(51) Int. Cl.
 *H01L 21/44* (2006.01)
(52) U.S. Cl. .............. 438/109; 257/E23.011
(58) Field of Classification Search ............ 438/459, 438/669, 670–673, 675, 720–722, 977, 478, 438/184, 193, 195–198, 200, 218, 237, 165, 438/294, 308, 337, 353, 378, 401, 6, 210, 438/104, 107–114, 118, 121–123, 128–129, 438/135, 142, 145, 149, 151, 157, 176
See application file for complete search history.

(56) References Cited

U.S. PATENT DOCUMENTS

| | | | | |
|---|---|---|---|---|
| 4,536,951 A * | 8/1985 | Rhodes et al. | ............... | 29/589 |
| 4,670,091 A * | 6/1987 | Thomas et al. | ............. | 156/643 |
| 4,866,008 A * | 9/1989 | Brighton et al. | ........... | 437/189 |
| 4,917,759 A * | 4/1990 | Fisher et al. | ................ | 156/643 |
| 5,071,518 A * | 12/1991 | Pan | ............................ | 205/122 |
| 5,674,758 A * | 10/1997 | McCarthy | .................... | 438/26 |
| 5,753,529 A * | 5/1998 | Chang et al. | ............... | 438/118 |
| 6,020,217 A * | 2/2000 | Kuisl et al. | ................ | 438/106 |
| 6,124,198 A * | 9/2000 | Moslehi | ..................... | 438/622 |
| 6,174,804 B1 * | 1/2001 | Hsu | ................................. | 438/637 |
| 6,174,812 B1 * | 1/2001 | Hsiung et al. | ............. | 438/687 |
| 6,180,509 B1 * | 1/2001 | Huang et al. | .............. | 438/624 |
| 6,255,126 B1 * | 7/2001 | Mathieu et al. | ............ | 438/597 |
| 6,258,709 B1 * | 7/2001 | McDaniel | .................. | 438/622 |
| 6,271,135 B1 * | 8/2001 | Palmans et al. | ........... | 438/687 |
| 6,274,499 B1 * | 8/2001 | Gupta et al. | ................ | 438/692 |
| 6,313,037 B1 * | 11/2001 | Kajita et al. | ............... | 438/687 |
| 6,368,951 B2 * | 4/2002 | Higashi et al. | ............. | 438/622 |
| 6,395,633 B1 * | 5/2002 | Cheng et al. | .............. | 438/637 |
| 6,444,576 B1 * | 9/2002 | Kong | ......................... | 438/667 |
| 6,538,333 B2 * | 3/2003 | Kong | ......................... | 257/777 |
| 6,569,762 B2 * | 5/2003 | Kong | ......................... | 438/667 |
| 6,642,081 B1 * | 11/2003 | Patti | ............................ | 438/109 |
| 6,746,938 B2 * | 6/2004 | Uchiyama et al. | ......... | 438/459 |
| 2002/0027022 A1 * | 3/2002 | Moriizumi | .................. | 174/267 |
| 2002/0155692 A1 * | 10/2002 | Kong | ......................... | 438/613 |
| 2002/0160598 A1 * | 10/2002 | Kong | ......................... | 438/613 |
| 2003/0003724 A1 * | 1/2003 | Uchiyama et al. | ......... | 438/667 |
| 2004/0048459 A1 * | 3/2004 | Patti | ............................ | 438/612 |
| 2004/0173890 A1 * | 9/2004 | Moriizumi | .................. | 257/678 |

* cited by examiner

*Primary Examiner*—Michael Lebentritt
*Assistant Examiner*—Andre' Stevenson
(74) *Attorney, Agent, or Firm*—Kathy Ortiz

(57) ABSTRACT

A substrate with at least one conductive post formed prior to the formation of an inter-layer dielectric (ILD) coating on the substrate. The conductive post may be formed from a metal layer of the substrate. Additionally, the conductive post may be built up on the substrate.

14 Claims, 11 Drawing Sheets

SUBSTRATE CONDUCTIVE POST FORMATION

BACKGROUND

Embodiments described herein relate to substrates for semiconductors including package substrates, integrated circuit substrates, and substrates for printed wiring boards. In particular, embodiments described herein relate to electronic coupling between different package substrate layers and between package substrates and other devices such as integrated circuits.

BACKGROUND OF THE RELATED ART

In the fabrication of microchips or integrated circuits, semiconductor wafers are processed and sliced into individual integrated circuits. The integrated circuits may then be used in a wide variety of devices. For example, an integrated circuit may be used in an electronic device by being electronically coupled to a printed circuit board (PCB) of the device. However, prior to such an electronic coupling, packaging takes place. Packaging is the manner by which a semiconductor wafer is separated into individual integrated circuits that are then protected in various package forms. The protective packages prevent damage to the integrated circuit and provide an electrical path to the circuitry of the integrated circuit.

The package includes a protective package substrate to which the integrated circuit is coupled. The package substrate includes a core and its own multi-layered circuitry. Vias may be present to provide electrical paths between layers of the package substrate. Some of the vias may run from a surface of the package substrate through layers of the package substrate as well as through the core. Other vias may run from one layer of the package substrate or a surface of the package substrate and through other layers of the package substrate but stop short of running through the core. At a first surface of the package substrate, the vias may terminate bond pads which couple to the integrated circuit. An opposite surface of the package substrate is to be coupled to a PCB.

The packaging process involves the coupling of the integrated circuit to the package substrate. This is done by coupling the bond pads noted above to an array of metal bumps or other conductive features of the integrated circuit. The metal bumps are coupled to the internal circuitry of the integrated circuit. In this manner, the internal circuitry of the integrated circuit is accessible to the PCB through the package substrate. The vias described above, present through portions of the package substrate, play a role in regulating this access.

Certain vias, as described above, may go entirely through the core of the package substrate. Other vias may be isolated vias, present through only a portion of the package substrate. The particular layering and via pattern configuration utilized is a matter of design choice involving several factors related to the purposes to be served by the particular package substrate.

In order to form a package substrate with vias as described above, a core material is initially provided. Once a pattern of vias to traverse the core is determined, these particular vias will be machine drilled, punched, or etched through the core. These core intersecting vias are then filled with an organic resin such as an epoxy which is then cured. The opposite surfaces of the package substrate are then planarized.

A photo-lithographic and etching process may then be used to convert the uniform metal layers at the top and bottom of the core into patterned features such as metal traces that, for example, may couple to the core intersecting vias. In order to protect and insulate the metal traces, a layer of dielectric filling material is added above and between individual circuits at the top and bottom of the incomplete package substrate. The outer layers of dielectric material are then cured leaving a package substrate substantially encased by dielectric material. Subsequent layers of circuitry may be added in a similar manner once vias, through the dielectric material as described below, are drilled.

Unfortunately, patterned circuit features such as the metal traces and core intersecting vias described above are left covered by dielectric material and inaccessible to, for example, the above-mentioned bond pads. Therefore, vias are drilled through the dielectric material to provide access to individual underlying features. However, the cured dielectric material is quite robust and stable making drilling quite difficult. Presently, a time consuming and expensive laser drilling process is employed to pierce the dielectric material and provide electrical access to the individual underlying features. The amount of time and expense incurred is compounded by the fact that an independent laser drilling process will be repeated for every layer of features to be added to the package substrate.

DETAILED DESCRIPTION

Descriptions of package substrate embodiments follow. In particular, embodiments of package substrates with conductive posts are disclosed. The package substrate may include metal traces, conductive posts as noted, and other features which are formed as layers of the package substrate are formed. Notably, a conductive post of the package substrate may be formed prior to formation of an inter-layer dielectric (ILD) coating of the substrate. This provides a degree of efficiency heretofore unseen in the formation of such a completed package substrate. Aspects of such embodiments of package substrates and related methods are described and illustrated by the accompanying drawings.

While embodiments are described with reference to particular semiconductor packages, the embodiments are applicable to any semiconductor substrate including integrated circuit substrates and substrates for printed wiring boards. Embodiments may be particularly useful when a package substrate of multi-layered circuitry and ILD material or coatings is employed requiring electrical coupling between multiple layers. A method is described where a metal layer of a substrate is formed into at least one conductive post. Another method is described where a conductive post is built up above a portion of the substrate.

Figure 1:
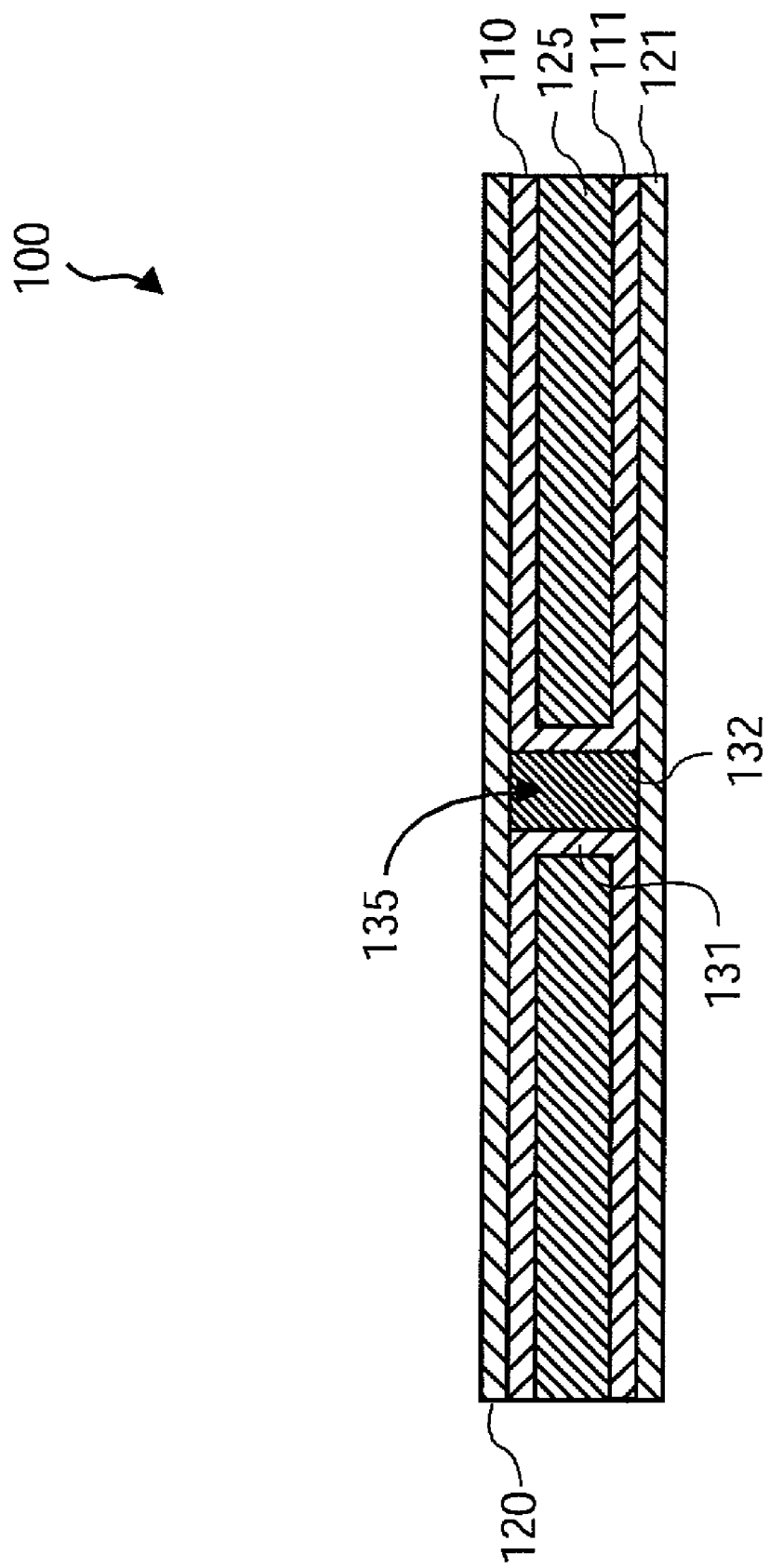
FIG. 1 is a cross-sectional view of an embodiment of a metalized package substrate.

Referring now to FIG. 1, an embodiment of a package substrate 100 is shown having circuit material layers 110, 111 and post material layers 120, 121 described further below. In one embodiment, the layers 110, 111, 120, 121 are formed by metalization which may include conventional chemical vapor deposition (CVD). The CVD may be plasma enhanced (i.e. a PECVD apparatus) and operated by conventional means.

Figure 6:
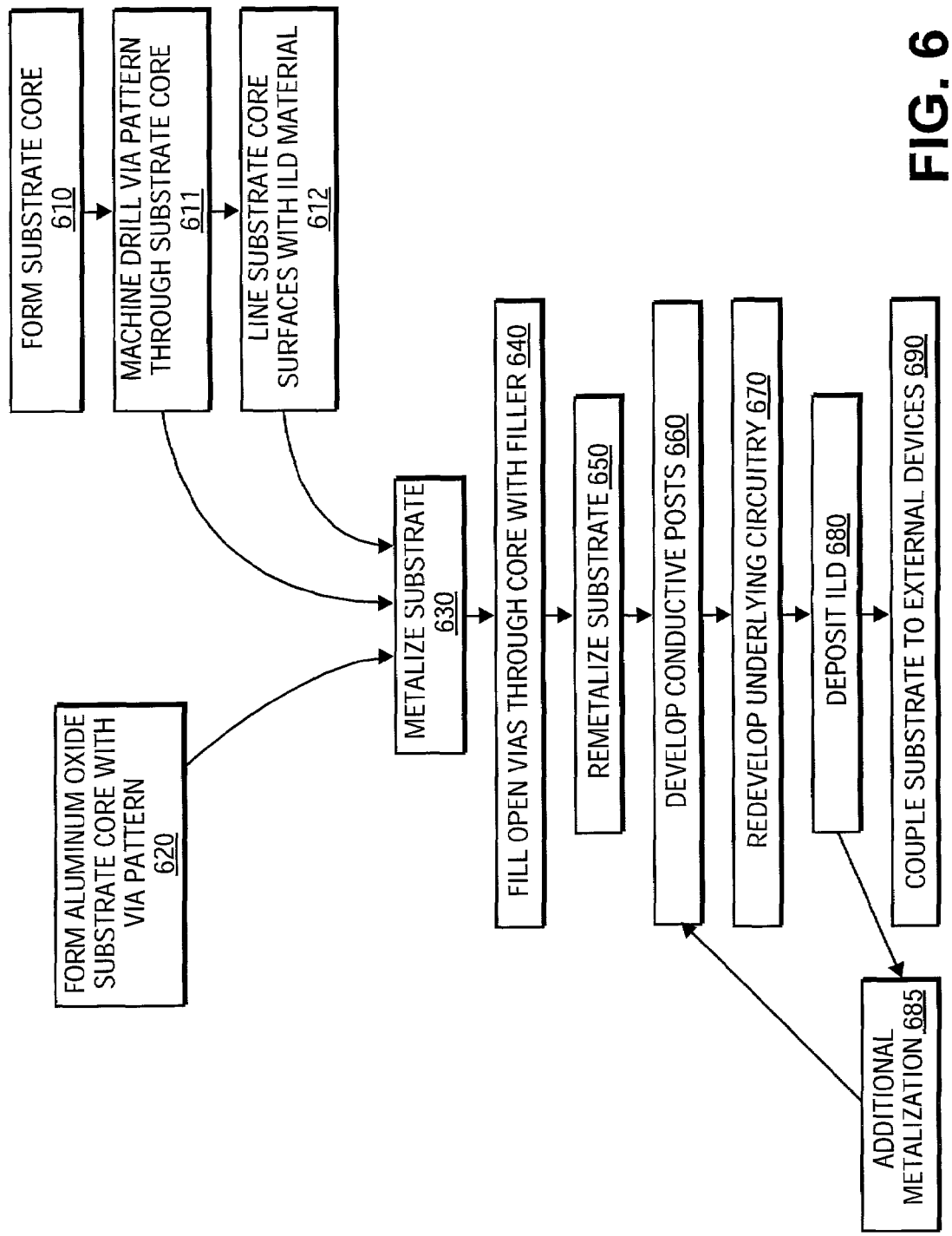
FIG. 6 is a flow chart summarizing embodiments of forming a package substrate with conductive posts.

Initially, circuit material layers 110, 111 are formed on a substrate core 125 of the package substrate 100 by metalization. Subsequently, post material layers 120, 121 are formed during remetalization of the package substrate 100 as shown at block 650 of FIG. 6. The post material layers 120, 121 allow for the formation of conductive posts 220, 221 (see FIG. 2) as also described further herein. FIG. 6 depicts a flow-chart summarizing certain embodiments described herein, where a metal layer is deposited on a substrate and subsequently formed into at least one conductive post. FIG. 6 is referenced throughout much of the following description as an aid in describing these embodiments.

Continuing with reference to FIG. 1, and with additional reference to FIG. 6, the package substrate 100 embodiment shown includes a via 135 intersecting a substrate core 125. In one embodiment, as shown at block 610 of FIG. 6, the substrate core 125 is formed from a fiber-reinforced epoxy, copper clad, or other conventional material. Preferably, the material chosen for the substrate core 125 is particularly suited for conventional machine drilling, punching, or etching. The via 135 is then formed by, for example, machine drilling a hole through the substrate core 125 as shown at block 611 of FIG. 6. Additionally, as shown at block 612 of FIG. 6, where the substrate core 125 includes a metal, all surfaces, including of the via 135, may be lined with an ILD material. In the embodiment shown, a single via 135 appears through the substrate core 125. However, a via pattern of one or more vias through the substrate core 125 may be employed.

Once the via 135 is formed in the substrate core 125, the package substrate 100 is metalized as indicated above and at block 630 of FIG. 6. Initial metalization includes forming upper 110 and lower 111 circuit material layers at the upper and lower surfaces of the substrate core 125. Additionally, during initial metalization, the inner surface of the via 135 will be plated with via circuit material layer 131. In one embodiment, a copper based material, deposited by conventional means such as PECVD, is used to form the circuit material layers 110, 111, 131.

In the embodiment shown, the circuit material layers 110, 111, 131, are between about 10 microns and about 20 microns in thickness. Additionally, the diameter of the via 135 may be greater than about twice the thickness of the via circuit material layer 131. Therefore, a portion of the via 135 may remain open. As shown at block 640 of FIG. 6, the remaining open portion of the via 135 is filled with a filler 132. In one embodiment, the filler 132 is an organic epoxy resin. The resin may be delivered by syringe or other means and forced into the open portion of the via 135 by sweeping or scraping across the surface of the upper 110 or lower 111 circuit material layers. The resin is then cured. Once the circuit material layers 110, 111, 131, and filler 132 have been formed as indicated, the surfaces of the upper 110 and lower 111 circuit material layers are planarized by conventional means for further processing.

Continuing with reference to FIG. 1, and with additional reference to FIG. 6, the package substrate 100 is remetalized as shown at block 650. For remetalization, a post material is introduced into a remetalization reactor in vapor form. In one embodiment, radio frequency (RF) is applied through the remetalization reactor to excite the post material to a plasma state. In this manner, the post material is deposited on the surfaces of the upper 110 and lower 111 circuit material layers. In one embodiment, the circuit material layers 110, 111 are individually formed, one at a time, with the package substrate 100 exposing one surface at a time for the indicated metalization.

Alternate embodiments of depositing post material may be employed. For example, the post material may be excited at a site remote from the remetalization reactor. Additionally, remetalization may proceed at conventional pressures, temperatures, RF, and power. For example, in one embodiment, pressure is maintained between about 2.0 Torr and about 10.00 Torr, a susceptor supporting the package substrate 100 heated to between about 250° C. and about 450° C., RF maintained at standard frequencies, and between about 1,600 watts and about 1,800 watts supplied.

Figure 2:
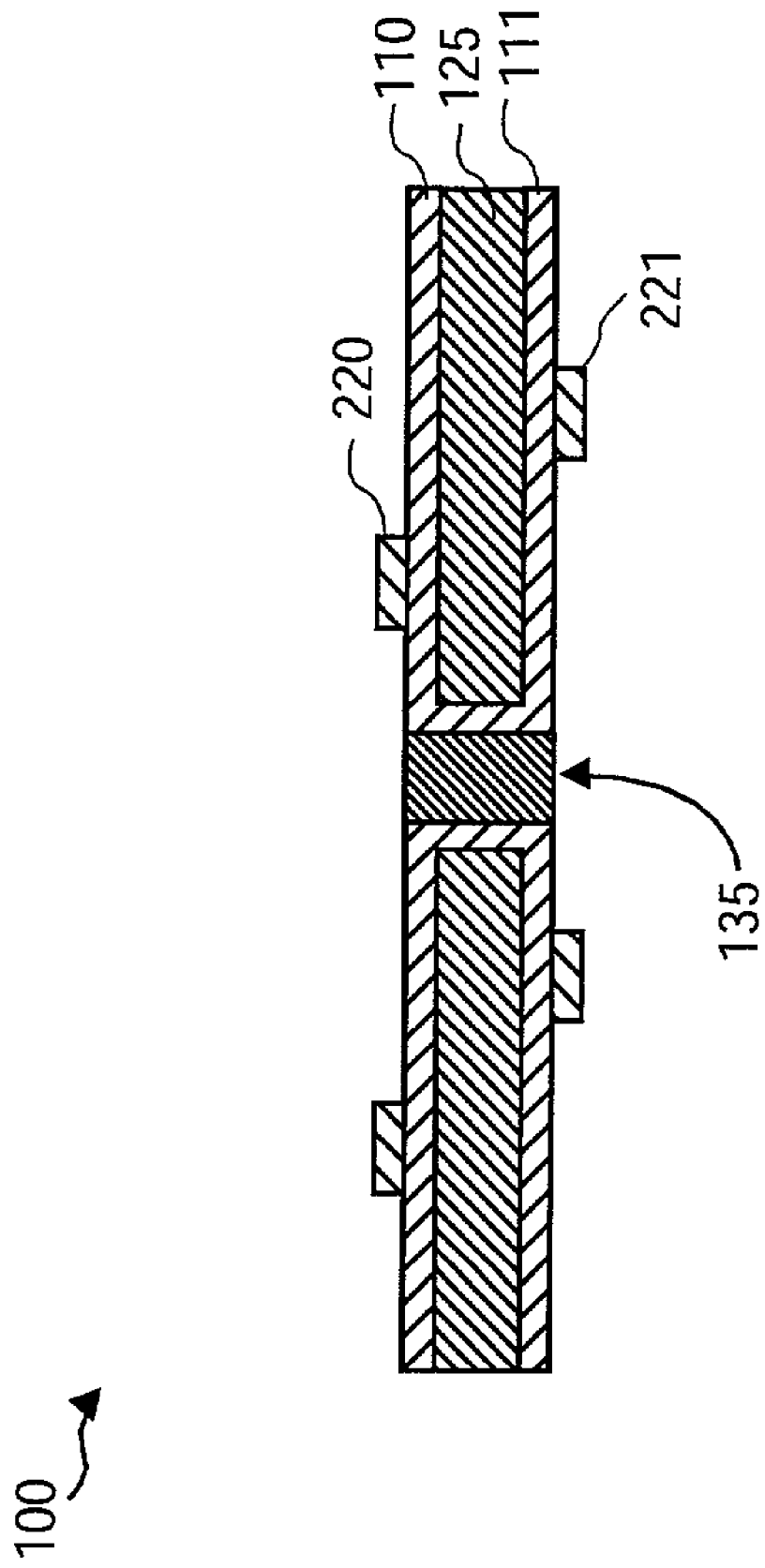
FIG. 2 is a cross-sectional view of the package substrate of FIG. 1 following an initial photomasking and developing process.

Referring to FIGS. 1 and 2, with additional reference to FIG. 6, a photomasking and developing process to form conductive posts 220, 221 is described (see block 660 of FIG. 6). A photoresist material is initially applied above the post material layers 120, 121 to form a positive acting photoresist as described further herein. The photoresist material may include conventional photosensitive materials resistant to developing etchants but susceptible to deterioration upon exposure to an energy source such as light of certain wavelengths. The photoresist material may be delivered in liquid form by syringe, or other conventional means, and solidified.

The photoresist is then patterned with a photomasking tool to expose portions of the post material layers 120, 121. In one embodiment, the photomasking tool includes a post pattern with a reticle which delivers a pattern of ultraviolet light to cause the indicated removal. Additionally, the photoresist may be delivered and patterned on the post material layers 120, 121 one at a time.

Once the photoresist is patterned, unaffected portions of the photoresist remain to protect underlying portions of the post material layers 120, 121. Therefore, upon etching of the post material layers 120, 121 conductive posts 220, 221 are formed as shown in FIG. 2. Conventional etchants suited for removal of the material of the post material layers 120, 121 are utilized. The remaining unaffected portions of the photoresist are then removed, for example, by an exposure similar to that described above. In an alternate embodiment, conventional solvent developers are used to remove remaining photoresist.

Figure 3:
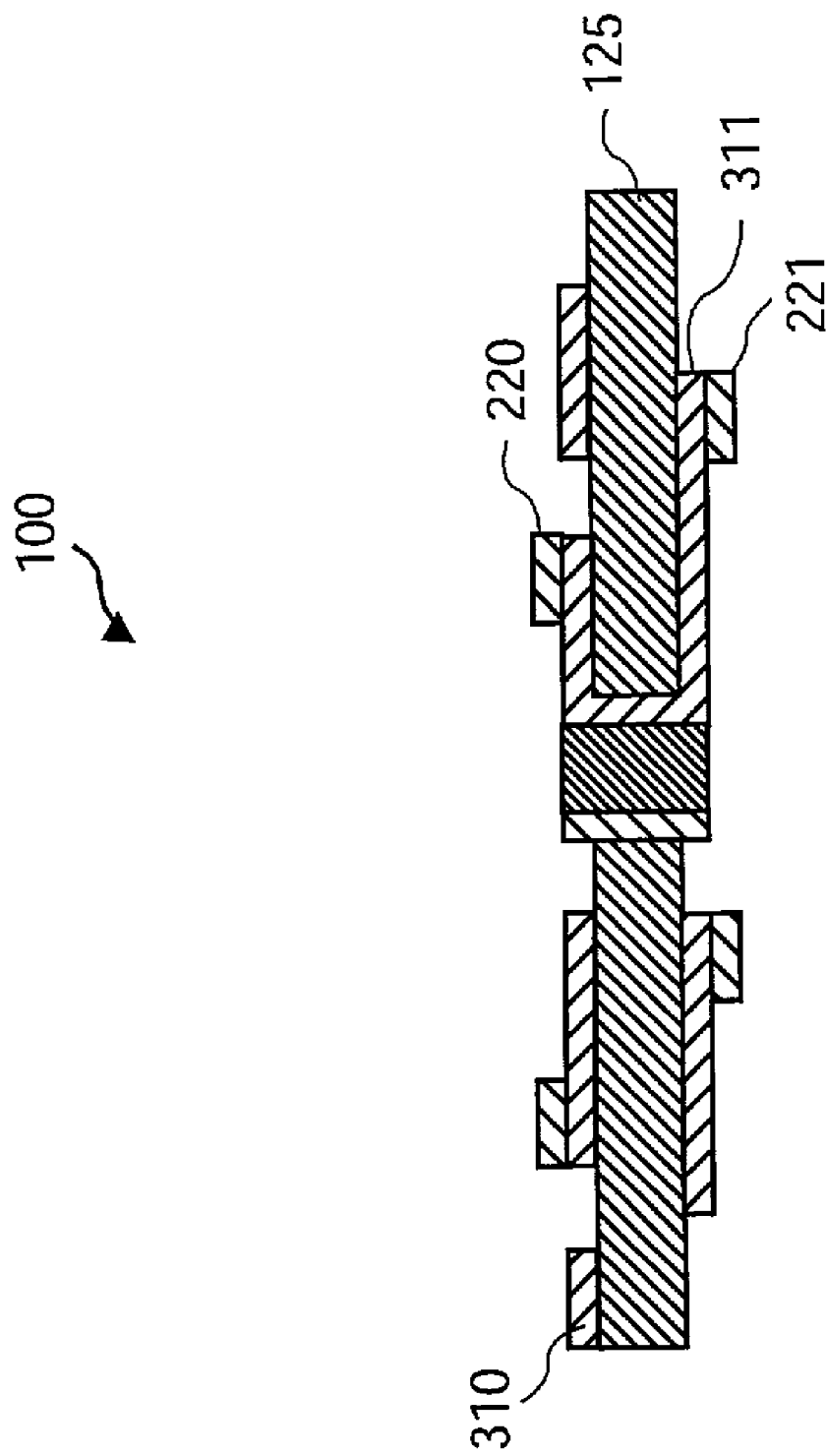
FIG. 3 is a cross-sectional view of the package substrate of FIG. 2 following a subsequent photomasking and redeveloping process.

Referring to FIG. 3, with additional reference to FIG. 6, a redeveloping process as shown at block 670 of FIG. 6, is described. Similar to the patterning and developing process described above, where conductive posts 220, 221 are formed from the post material layers 120, 121 (see FIG. 1), a photoresist is again formed on the package substrate 100. However, the redeveloping described herein is performed to pattern individual circuit features, such as metal traces, referred to here as patterned circuitry 310, 311. The patterned circuitry 310, 311 is formed from the circuit material layers 110, 111 shown in FIG. 2.

A photoresist is applied above the circuit material layers 110, 111 and exposed to a photomasking tool with a circuit pattern. Following exposure to the photomasking tool and additional etching as described above, patterned circuitry 310, 311 is formed from the circuit material layers 110, 111 shown in FIG. 2. Remaining unaffected portions of the photoresist are then removed. Again, the redeveloping process described above may be applied to the circuit material layers 110, 111 (see FIG. 2) one at a time.

Continuing with reference to FIG. 3, the conductive posts 220, 221 are shown directly coupled to underlying patterned circuitry 310, 311. As described further below, the conductive posts 220, 221 may be made accessible to devices external to the package substrate 100. This allows for avoiding the expense and, time otherwise required for laser drilling in order to access such underlying patterned circuitry 310, 311.

Figure 4:
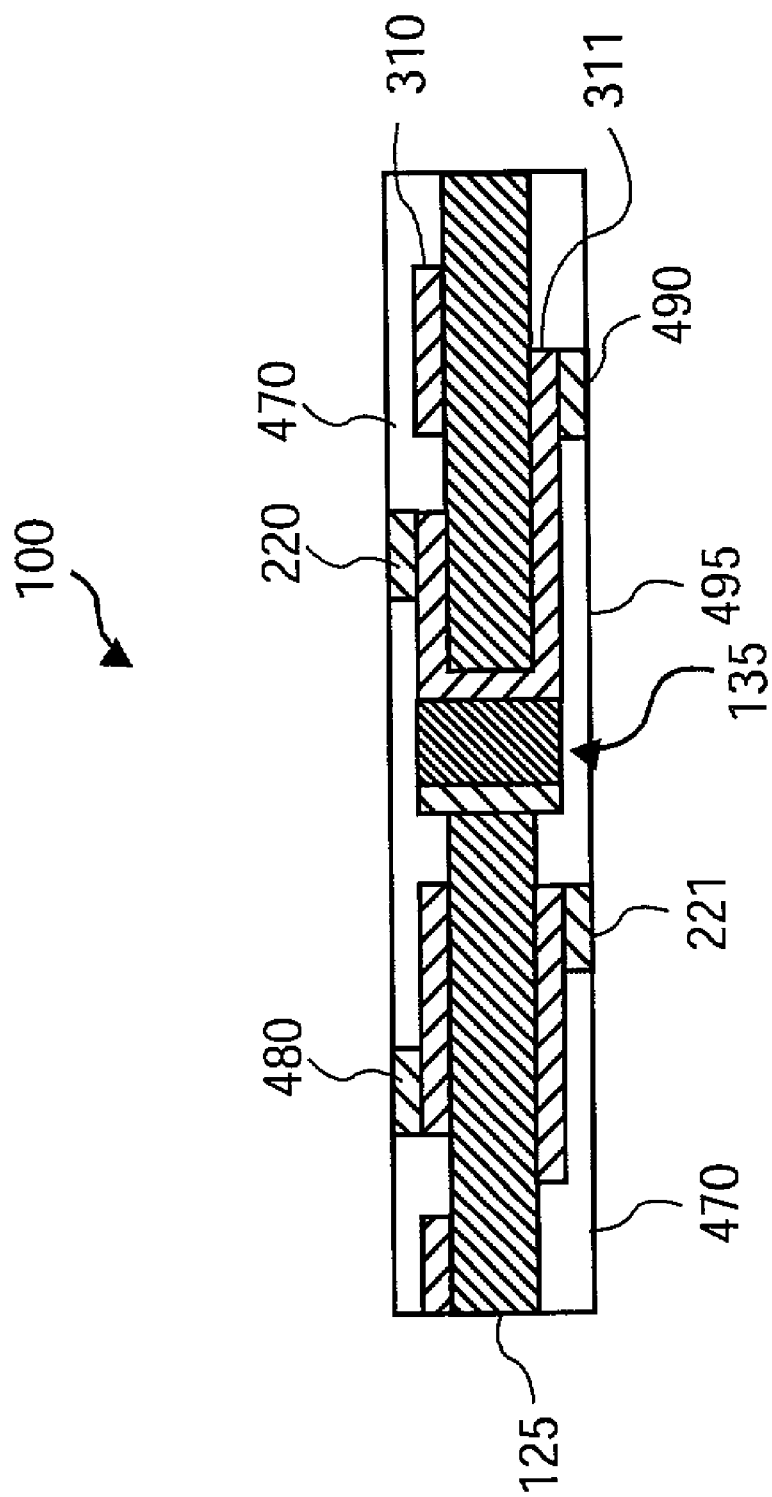
FIG. 4 is a cross-sectional view of the package substrate of FIG. 3 following deposition of an Inter-Layer Dielectric (ILD) material.

Referring to FIG. 4, with additional reference to FIG. 6, the package substrate 100 with completed conductive posts 220, 221 and underlying patterned circuitry 310, 311, is shown following ILD deposition as shown at block 680 of FIG. 6. A dielectric deposition reactor which may be a conventional CVD apparatus may be used to deposit ILD coatings 470 on the package substrate 100. The CVD apparatus may be operated at conventional pressures, temperatures, RF, and power. An ILD material may be introduced into the dielectric deposition reactor in vapor form and RF applied to excite the ILD material to a plasma state. In this manner, the ILD material is deposited to form ILD coatings 470 which encase the patterned circuitry 310, 311 and conductive posts 220, 221. The cross-sectional view of the package substrate 100 shown in FIG. 4 reveals transparent ILD coatings 470, as ILD material is often naturally transparent.

The ILD material used may be of low capacitance for isolation the patterned circuitry 310, 311. In one embodiment, the ILD material used includes carbon doped oxide (CDO) materials to ensure lowered capacitance. Additionally, the ILD coatings 470 may be formed on one side of the package substrate 100 at a time.

Once the ILD coatings 470 are formed, the package substrate 100 is placed in a conventional reflow oven or other apparatus for curing of the ILD coatings 470. The outer surfaces of the package substrate 100 are then planarized, for example by Chemical mechanical polishing (CMP), ensuring that ILD surface material 495 does not cover any portions of the surfaces 480, 490 of the conductive posts 220, 221.

While the patterned circuitry 310, 311 is insulated by ILD coatings 470, the surfaces 480, 490 of the conductive posts 220, 221 are exposed as described above. Therefore, since the conductive posts 221, 320 are directly and electrically coupled to the patterned circuitry 310, 311, there is no need for any laser drilling or any other procedure to provide access to the patterned circuitry 310, 311 from outside of the package substrate 100. As shown in FIG. 6 at block 685 additional layers of metalization for additional patterned circuitry and conductive post formation may actually follow the ILD deposition (shown in block 680) with interconnection provided by conductive posts.

Figure 5:
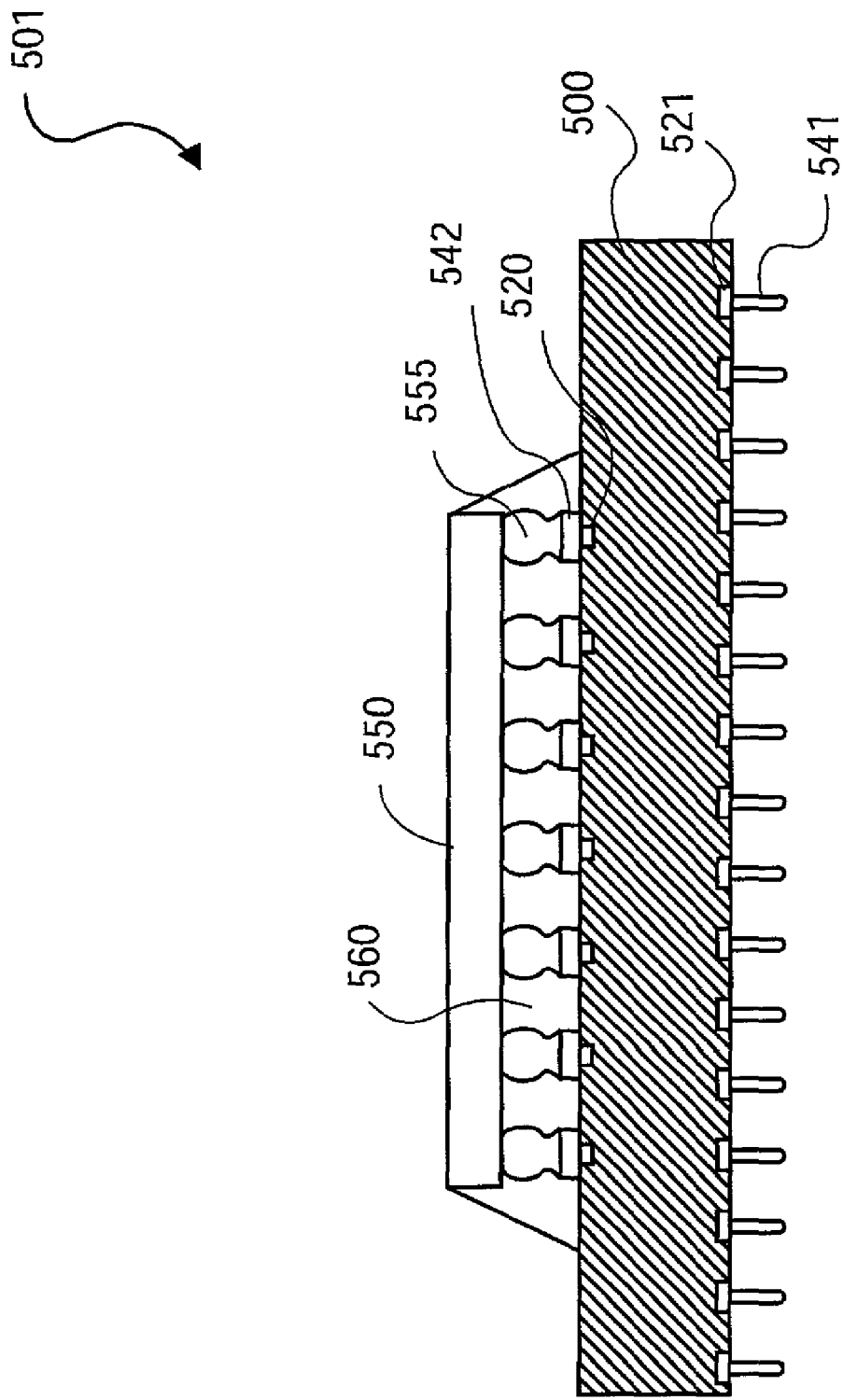
FIG. 5 is a cross-sectional view of a semiconductor package with an embodiment of a package substrate.

Referring to FIGS. 5 and 6, once a package substrate 500 is formed according to an embodiment described above, it may be coupled to an external device as shown in block 690. A semiconductor package 501 is shown in FIG. 5. The semiconductor package 501 includes a package substrate 500 with upper 520 and lower 521 conductive posts formed according to embodiments described above. For further processing, as described below, nickel or gold based material may be applied to the surfaces of the conductive posts 520, 521.

Conductive pins 541 are shown coupled to the surfaces of the lower conductive posts 521. In one embodiment, the conductive pins 541 are of copper and in the form of a pin grid array as shown. However, other conductive means, such as ball grid arrays may be employed at this portion of the package substrate 500 for coupling of the semiconductor package 501 to an external device such as a PCB. In the embodiment shown, the conductive pins 541 are electrically coupled through the lower conductive posts 521 and internal circuitry of the package substrate 500 to the upper conductive posts 520.

Electrically conductive bond pads 542 are shown at the surface of the upper conductive posts 520. In the embodiment shown, an integrated circuit 550 is placed above the package substrate 500 by a conventional pick and place mechanism. Conductive metal bumps 555 of the integrated circuit 550 are aligned with the bond pads 542 as the integrated circuit 550 is placed. The conductive metal bumps 555 may be of a tin lead, lead free, or other conventional solder material. In the embodiment shown, an underfill material 560, such as a conventional epoxy, is used to adhere the integrated circuit 550 to the package substrate 500. According to conventional practice, the semiconductor package 501 may be placed in a reflow apparatus for baking of the metal bumps 555 and underfill material 560.

Continuing with reference to FIG. 5, the integrated circuit 550 is shown electrically coupled to the package substrate 500 and electrically accessible through conductive pins 541 of the semiconductor package 501. This is achieved without requiring laser drilling or other time consuming or expensive measures in order to provide electrical access between the bond pads 542 and the conductive pins 541. Additionally, coupling between conductive posts 520, 521 and the bond pads 542 or conductive pins 541 is achieved without requiring soldermasking or other additional processing measures.

Referring to FIG. 6, the flow-chart summarizing certain embodiments described above is shown. With reference to the above description, FIG. 6 summarizes embodiments of forming conductive posts before ILD deposition from metal layers on a substrate provided through metalization. A substrate core is formed 610, 620, and metalized 630, 650, and metal layers thereon are developed forming posts 660 and any other circuitry 670.

Figure 7:
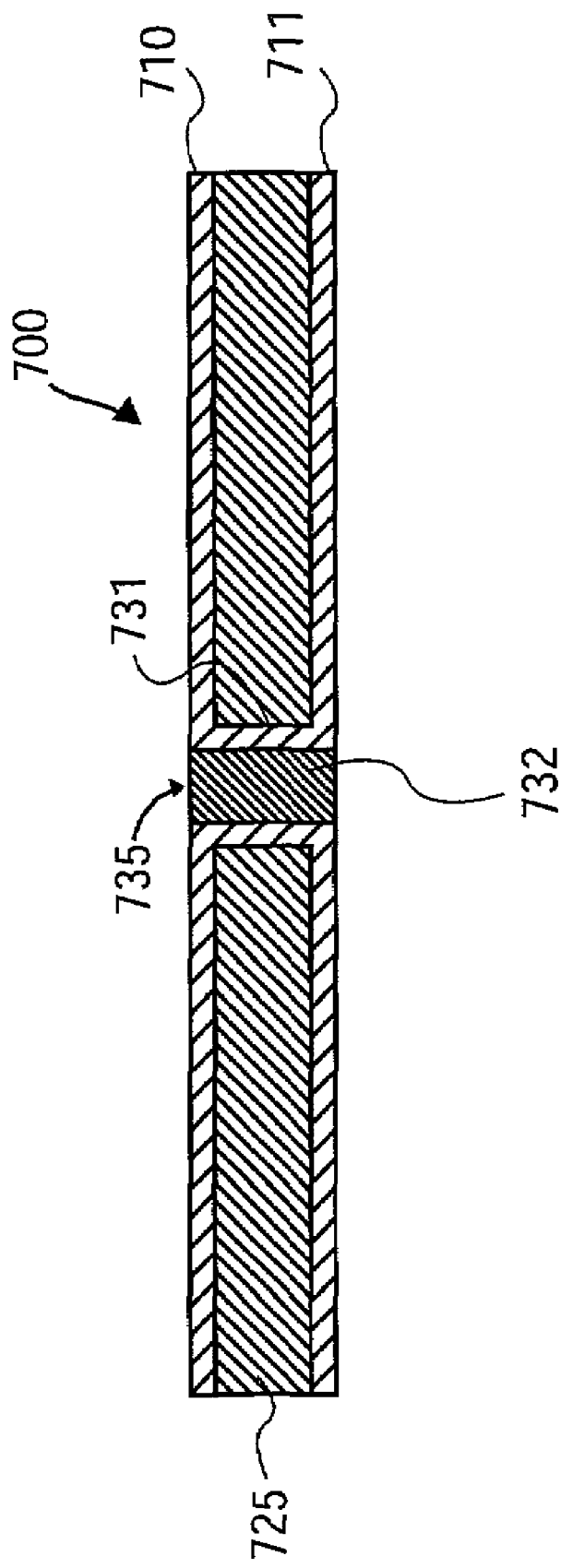
FIG. 7 is a cross-sectional view of an alternate embodiment of a metalized package substrate.
Figure 11:
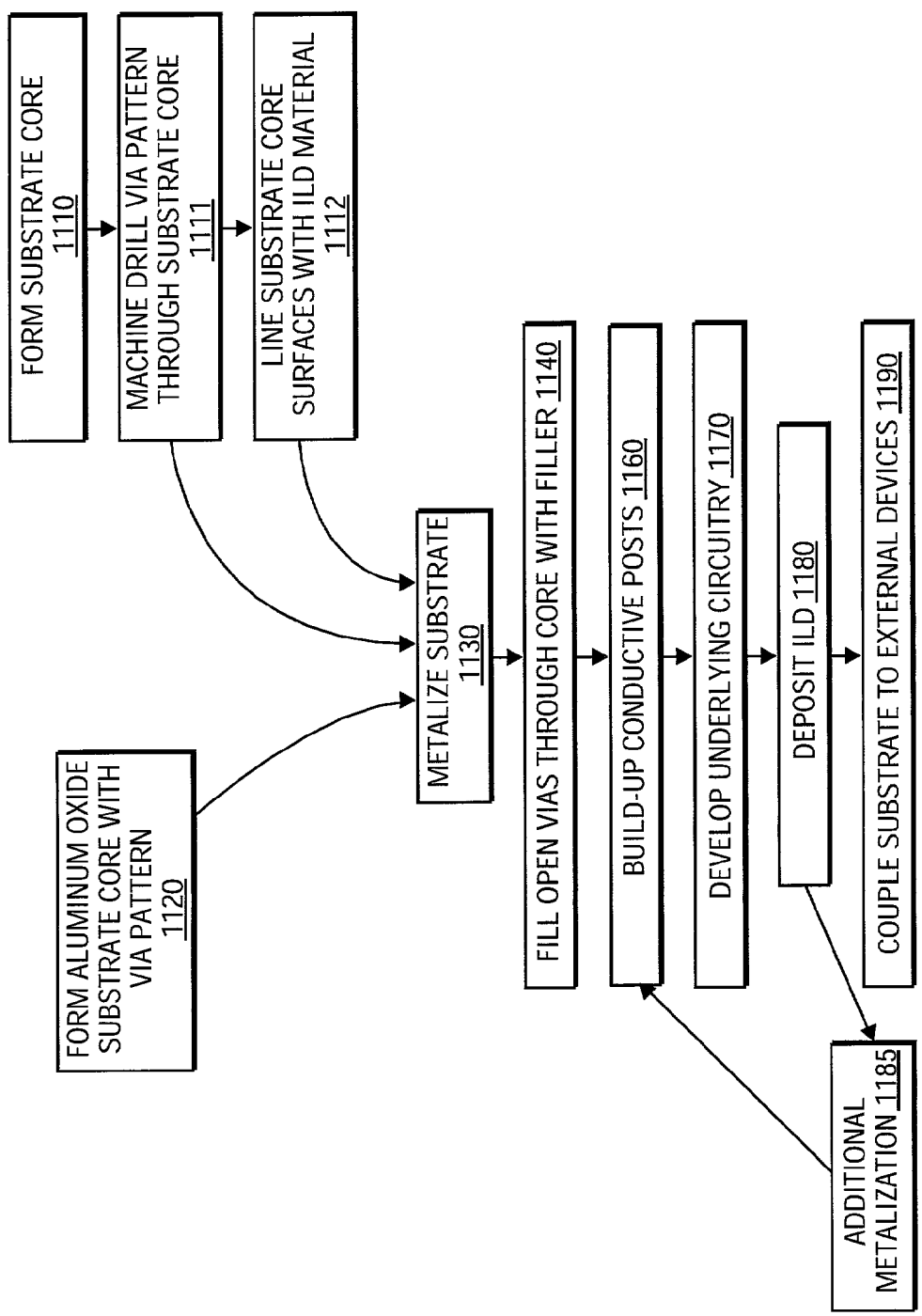
FIG. 11 is a flow chart summarizing alternate embodiments of forming a package substrate with conductive posts.

Referring to FIG. 7, an alternate embodiment is described where an additive process is employed to build-up conductive posts of a package substrate 700. FIG. 11 depicts a flow chart summarizing embodiments of such a process. FIG. 11 is referenced throughout the remainder of the following description as an aid in describing these embodiments.

Continuing with reference to FIG. 7, and with additional reference to FIG. 11, the package substrate 700 includes a via 735 intersecting a substrate core 725. The substrate core 725 and the via 735 are formed as shown at blocks 1110, 1111 and as described above with reference to the embodiment of FIG. 1. Additionally, as in the embodiment of FIG.

1, and as shown at block 1112, the via 735 and all other surfaces of the substrate core 725 may be lined with an ILD material where the substrate core 725 includes a metal.

As shown at block 1130, once the via 735 is formed, the package substrate 700 is metalized. Initial metalization includes forming upper 710 and lower 711 circuit material layers at the upper and lower surfaces of the substrate core 725. Additionally, during initial metalization, the inner surface of the via 735 will be plated with via circuit material layer 731. In one embodiment, a copper based material, deposited by conventional means such as PECVD, is used to form the circuit material layers 710, 711, 731.

In the embodiment shown, as in the embodiment of FIG. 1, the circuit material layers 710, 711, 731, are between about 10 microns and about 20 microns in thickness. Additionally, the diameter of the via 735 may be greater than about twice the thickness of the via circuit material layer 731. Therefore, a portion of the via 735 may remain open. The remaining open portion of the via 735 is filled with a filler 732 as shown at block 1140 of FIG. 11. The filler may be an organic epoxy resin. Once the circuit material layers 710, 711, 731, and filler 732 have been formed as indicated, the surfaces of the upper 710 and lower 711 circuit material layers are planarized by conventional means for further processing.

Figure 8:
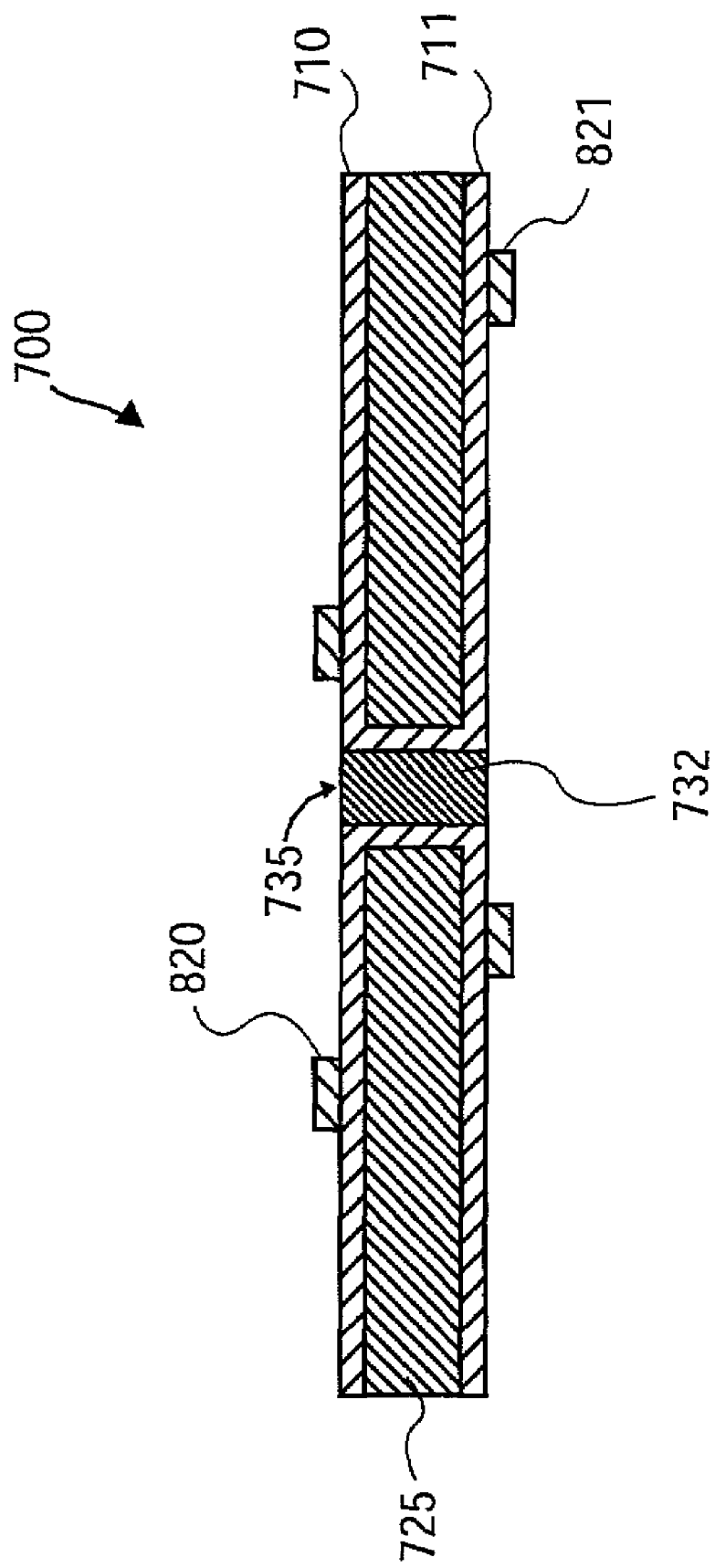
FIG. 8 is a cross-sectional view of the package substrate of FIG. 7 following an initial photomasking and developing process.

Referring now to FIG. 8, with additional reference to FIG. 11, a build-up process to form conductive posts 820, 821 as shown at block 1160 is described. By way of contrast with the embodiment shown in FIG. 1, remetalization of the package substrate 700 is not used to provide a stable metal layer from which conductive posts may be formed. Rather, a photomasking and redeveloping process may be applied to the package substrate 700 once the circuit material layers 710, 711 are formed. In this embodiment, a positive acting photoresist may be applied directly to the circuit material layers 710, 711. As described with reference to the embodiment of FIG. 1, material to form the photoresist may be delivered in liquid form by syringe, or other conventional means, and solidified. In one embodiment, remetalization takes place prior to application of the photoresist in order to increase the thickness of the circuit material layers 710, 711 and cover the via 735. However, the added metalization is not required for formation of conductive posts.

Figure 9:
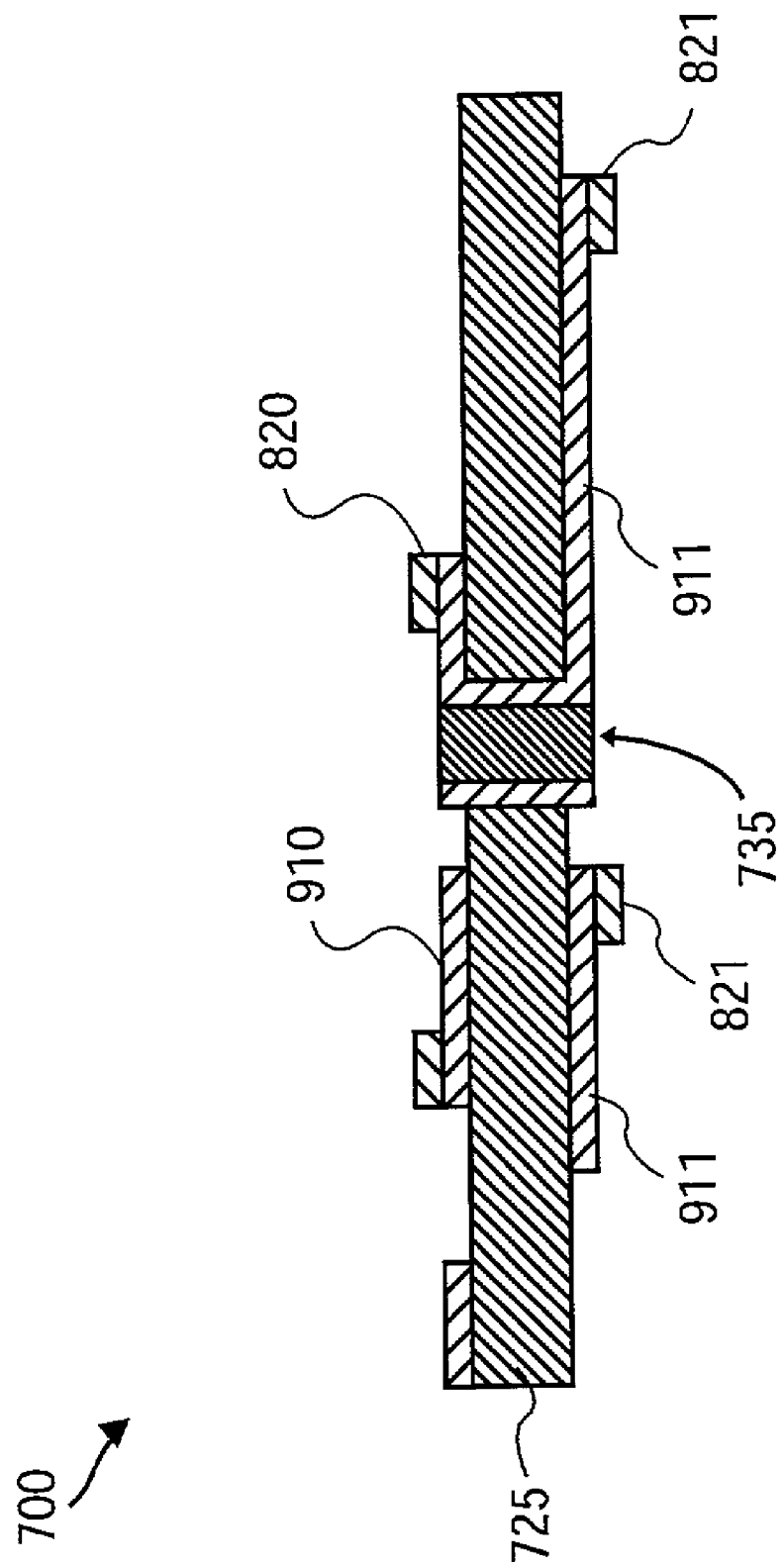
FIG. 9 is a cross-sectional view of the package substrate of FIG. 8 following a subsequent photomasking and redeveloping process.

Referring to FIGS. 8 and 9, the photoresist is exposed to a photomasking tool with a post pattern. The post pattern is configured to cause removal of the photoresist where conductive posts 820, 821 are formed as described here. That is, following exposure to the photomasking tool, the package substrate 700 is placed in a metalization reactor similar to that described with reference to FIG. 1. The metalization reactor deposits a metal to form conductive posts 820, 821. Due to the removal of portions of the photoresist corresponding portions of the circuit material layers 710, 711 are exposed allowing a metalization build up of conductive posts 820, 821 there above when the reactor is activated.

Referring to FIG. 9, with additional reference to FIG. 11, a developing process is described that is applied to the circuit material layers 710, 711 as shown at block 1170. The package substrate 700 with conductive posts 820, 821 is placed within a photomasking apparatus to pattern circuitry 910, 911 from the circuit material layers 710, 711.

Similar to the embodiment shown in FIG. 3, a photoresist is applied to the circuit material layers 710, 711 and exposed to a photomasking tool with a circuit pattern. Following exposure to the photomasking tool and etching, at least one layer of the patterned circuitry 910, 911 is formed from the circuit material layers 710, 711.

Continuing with reference to FIG. 9, the package substrate 700 reveals conductive posts 820, 821 directly coupled to underlying patterned circuitry 910, 911. As with the embodiments described with reference to FIGS. 1-6, these conductive posts 820, 821 may couple to external devices and allow access to the circuitry of the package substrate 700. As described below this will allow such access without requiring the time and expense that would otherwise be required for laser drilling through an ILD coating 1070 (see FIG. 10) to access such underlying circuitry.

Figure 10:
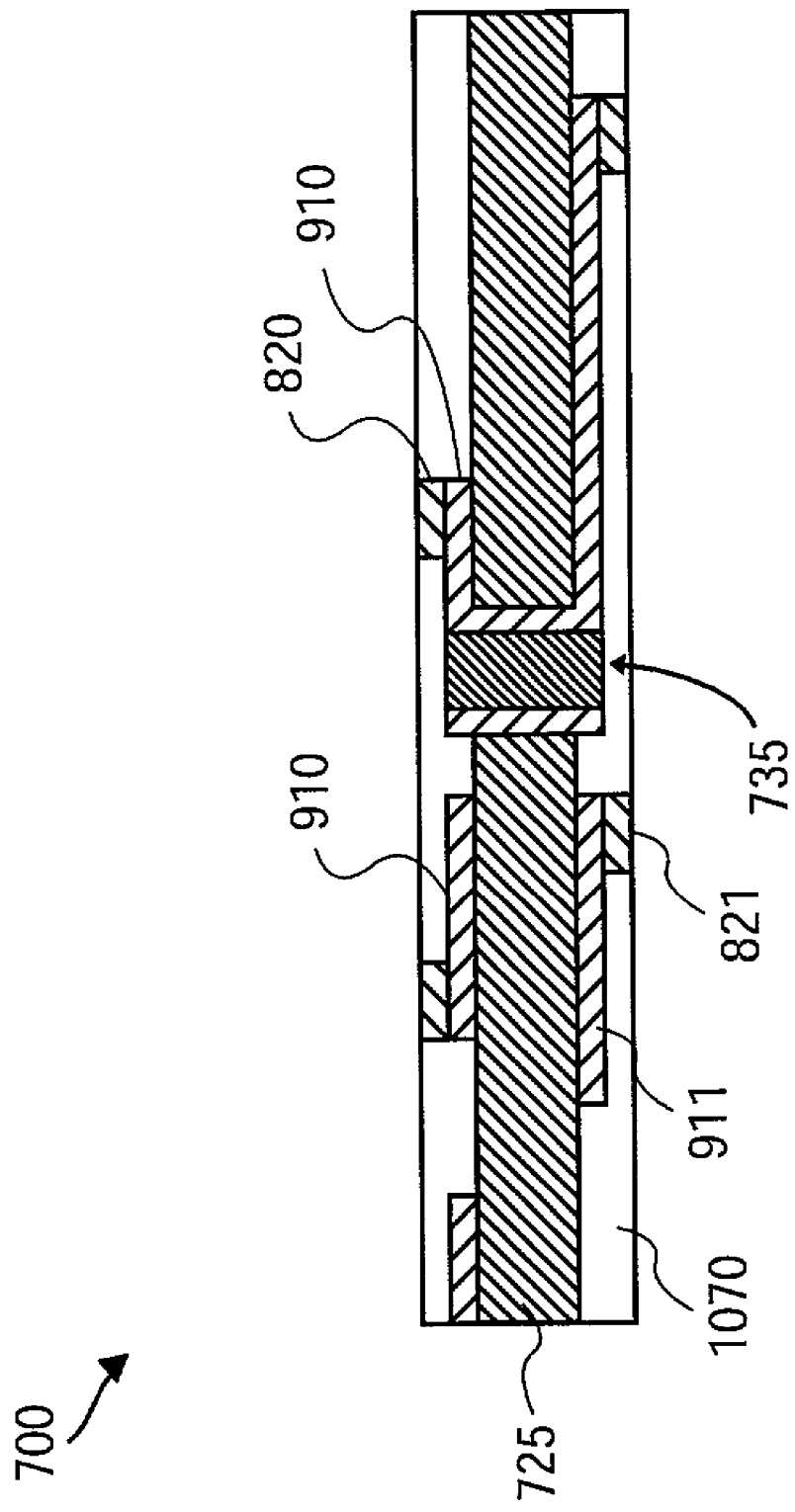
FIG. 10 is a cross-sectional view of the package substrate of FIG. 9 following deposition of an ILD material.

Referring to FIGS. 10 and 11 the package substrate 700 with completed conductive posts 820, 821 and underlying patterned circuitry 910, 911 is placed in a dielectric deposition reactor for ILD deposition as shown at block 1180 similar to that described with reference to FIG. 4. The dielectric deposition reactor may be a conventional PECVD apparatus operated at conventional pressures, temperatures, RF, and power.

ILD material is introduced in vapor form and RF applied to excite the ILD material 1060 to a plasma state. In this manner, the ILD material 1060 is deposited above the upper patterned circuits 1010 and between the upper conductive posts 920. In the embodiment shown, the ILD material 1060 has already been deposited above the lower patterned circuitry 911 and between the lower conductive posts 821 forming an insulating ILD coating 1070.

As in the embodiment described with reference to FIG. 4, reflow may follow for curing of the ILD coating 1070 shown in FIG. 10. The outer surfaces of the package substrate 700 may then be planarized by conventional CMP to ensure that the conductive posts 820, 821 are exposed. Because the conductive posts 820, 821 are directly and electrically coupled to the patterned circuitry 910, 911, there is no need for any laser drilling or any other procedure to provide access to the patterned circuitry 910, 911 from outside of the package substrate 700. As shown in FIG. 11, in an embodiment similar to that shown in FIG. 6, additional layers of metalization as shown at block 1185 for additional circuitry and conductive post formation may actually follow ILD deposition (shown at block 1180).

The package substrate formed as described with reference FIGS. 7-10 may be used to form a semiconductor package 500 as shown and described with reference to FIG. 5. As described above with reference to FIG. 5, such a package substrate 500 may be coupled to an external device as shown at block 1190 of FIG. 11 such as an integrated circuit 550 or a PCB. This is achieved without requiring laser drilling or other time consuming or expensive measures in order to provide electrical access between the bond pads 542 and the conductive pins 541. Additionally, coupling between conductive posts 520, 521 and the bond pads 542 or conductive pins 541 is achieved without requiring soldermasking or other additional processing measures.

Referring to FIG. 11, the flow chart summarizing certain embodiments described above is shown. With reference to the above description, FIG. 11 summarizes embodiments of forming conductive posts by a process of building up the posts as shown at block 1160 of a substrate. A substrate core is formed as shown at blocks 1110, 1120, metalized as shown at block 1130, and posts built up as shown at block 1160, followed by developing of underlying circuitry as shown at block 1170.

The above methods of forming conductive posts may be combined. For example, this may be the case in an embodiment where first conductive posts are formed, ILD coating formed, and additional conductive posts are to be formed above the ILD coatings. In this embodiment, the first conductive posts may be formed according to methods described with particular reference to FIG. 6 while the additional conductive posts are formed according to methods described with particular reference to FIG. 11, or vice versa.

Embodiments described above include package substrates with patterned circuits that are left accessible by, for example, bond pads and conductive pins, even after deposition and curing of dielectric material. This is accomplished by way of conductive posts of the package substrates. The conductive posts allow avoidance of laser drilling of vias through cured dielectric material in order to provide electrical access to the individual underlying layers of circuitry. Because laser drilled vias are avoided, subsequent metalization and other via processing measures are also avoided. This saves significant time and expense associated with laser drilling and related processing. The amount of time and expense saved is compounded by the fact that an independent laser drilling process would otherwise need to be repeated for every layer of circuitry of the package substrate.

Although exemplary embodiments describe particular methods of forming package substrates with conductive posts, additional embodiments are possible. For example, in addition to avoidance of laser drilling, machine drilling to form core intersecting vias may be avoided where an aluminum oxide core is employed. That is, where an aluminum oxide core material is used to form a substrate core by a conventional chemical anodizing means, core intersecting vias may be formed simultaneous with the formation of the core, eliminating the need for subsequent machine drilling (see blocks 620, 1120 of FIGS. 6 and 11). In another example, while different particular photolithographic techniques are described above, as a matter of design choice, alternate parameters may be employed. For example, a technique may be configured that does not utilize a positive acting photoresist. In yet another example, where the substrate is of an integrated circuit, conductive posts of tungsten or other suitable material may be formed as described above.

Embodiments described above include package substrates with conductive posts formed prior to encasing of circuitry with ILD material coatings. While particular methods of forming the package substrates and conductive posts are described, many changes, modifications, and substitutions may be made without departing from the spirit and scope of these embodiments.

I claim:

1. A method comprising:
    forming a first conductive post on a front side of a substrate and a second conductive post on a back side of the substrate, the back side opposite the front side, the first post electrically coupled with the second post; and
    forming an inter-layer dielectric coating on the front and the back side of the substrate after forming of the first and second conductive posts.

2. The method of claim 1 wherein forming of the first and second conductive posts includes forming the first and second conductive posts from a first and second metal layer of the substrate.

3. The method of claim 1 wherein forming the first and second conductive posts comprises a build-up process including selectively depositing a metal material in a defined location.

4. The method of claim 1 further comprising removing any portion of the inter-layer dielectric coating from a surface of the first and second conductive posts for electrical coupling of the first and second conductive posts to an external device.

5. The method of claim 1 wherein the substrate is for one of a printed wiring board, an integrated circuit, and a semiconductor package.

6. A method, comprising:
    placing a first photoresist on a surface of a first metal layer on a front side of a substrate, and a second photoresist on a surface of a second metal layer on a back side of the substrate, the back side opposite the front side;
    patterning a first post pattern into the first photoresist with a photomasking tool, and a second post pattern into the second photoresist with the photomasking tool; and
    depositing post material onto portions of the first and second metal layer to form a first and a second conductive post, said depositing directed by the first and second post patterns.

7. The method of claim 6 further comprising forming circuitry from the first and second metal layers.

8. The method of claim 7 further comprising depositing an inter-layer dielectric material above the circuitry.

9. A method comprising:
    metalizing a front side of a substrate to form a first metal layer thereon, the first metal layer to support a build up of a first conductive post thereon;
    metalizing a back side of the substrate, the back side opposite the front side, to form a second metal layer thereon, the second metal layer to support a build up of a second conductive post thereon;
    building up a first conductive post on the front side of the substrate;
    building up a second conductive post on the back side of the substrate; and
    forming an inter-layer dielectric coating n the front and the back side of the substrate after building up the first and the second conductive posts.

10. The method of claim 9 wherein the first and second metal layers are selected from the group consisting of copper and tungsten.

11. The method of claim 9 wherein the first and second metal layers are at least about 10 microns in thickness.

12. The method of claim 9 further comprising:
    forming the substrate from a core material; and
    providing a via pattern to the substrate prior to said metalizing.

13. The method of claim 12 wherein the via pattern is formed by one of machine drilling, punching, etching, and chemical anodizing of an aluminum oxide core material.

14. The method of claim 12 further comprising filling any open vias of the via pattern with a filler.

* * * * *